United States Patent [19]

Kawana et al.

[11] Patent Number: 6,147,890
[45] Date of Patent: Nov. 14, 2000

[54] FPGA WITH EMBEDDED CONTENT-ADDRESSABLE MEMORY

[75] Inventors: Keiichi Kawana, Sunnyvale; Michael D. Rostoker, Boulder Creek, both of Calif.

[73] Assignee: Kawasaki Steel Corporation, Tokyo, Japan

[21] Appl. No.: 09/166,503

[22] Filed: Oct. 5, 1998

Related U.S. Application Data

[60] Provisional application No. 60/070,036, Dec. 30, 1997.

[51] Int. Cl.$^7$ ........................................... G11C 15/00
[52] U.S. Cl. .................. 365/49; 365/189.08; 365/230.03
[58] Field of Search ......................... 365/49, 52, 230.03, 365/98, 189.08; 395/500, 284, 200.6

[56] References Cited

U.S. PATENT DOCUMENTS

| | | | |
|---|---|---|---|
| 4,646,271 | 2/1987 | Uchiyama et al. | 365/49 |
| 5,051,949 | 9/1991 | Young | 365/49 |
| 5,282,163 | 1/1994 | Shibata | 365/189.08 |
| 5,299,147 | 3/1994 | Holst | 365/49 |
| 5,388,065 | 2/1995 | Yoneda | 365/49 |
| 5,408,434 | 4/1995 | Stansfield | 365/189.08 |
| 5,426,769 | 6/1995 | Pawloski | 395/500 |
| 5,473,267 | 12/1995 | Stansfield | 326/41 |
| 5,515,327 | 5/1996 | Matsukawa et al. | 365/203 |
| 5,519,649 | 5/1996 | Takahashi | 364/736.5 |
| 5,557,218 | 9/1996 | Jang | 326/40 |
| 5,559,981 | 9/1996 | Racino et al. | 395/430 |
| 5,576,985 | 11/1996 | Holtz | 365/49 |
| 5,581,501 | 12/1996 | Sansbury et al. | 365/185.01 |
| 5,581,742 | 12/1996 | Lin et al. | 395/500 |
| 5,600,820 | 2/1997 | Johnston | 395/497.02 |
| 5,615,404 | 3/1997 | Knoll et al. | 395/882 |
| 5,664,198 | 9/1997 | Chen et al. | 395/733 |
| 5,685,006 | 11/1997 | Shiraishi | 395/800 |
| 5,687,325 | 11/1997 | Chang | 395/284 |
| 5,701,488 | 12/1997 | Mulchandani et al. | 395/704 |
| 5,838,908 | 11/1998 | Matzke et al. | 395/200 |

*Primary Examiner*—David Nelms
*Assistant Examiner*—Thong Le
*Attorney, Agent, or Firm*—Gerald E. Linden

[57] ABSTRACT

Content Addressable Memory (CAM) core is integrated and interfaced with a configurable logic core (e.g., FPGA) on a single integrated circuit (IC) chip to permit a user to change algorithms for and to tailor word length to a particular application. Significant improvements in fetch times and overhead are achieved. An electronic component (e.g., integrated circuit) incorporating the technique is suitably included in a system or subsystem having electrical functionality, such as general purpose computers, telecommunications devices, and the like.

7 Claims, 2 Drawing Sheets

FPGA WITH EMBEDDED CONTENT-ADDRESSABLE MEMORY

CROSS-REFERENCE(S) TO RELATED APPLICATION(S)

This application is a continuation-in-part of commonly-owned, copending U.S. Patent Application No. 60/070,036 filed Dec. 30, 1997, incorporated in its entirety by reference herein.

TECHNICAL FIELD OF THE INVENTION

The present invention relates to semiconductor memory devices and, more particularly, to Content Addressable Memory (CAM).

1. Background of the Invention

A conventional form of semiconductor memory is random access memory (RAM) in which information (data values) is stored as electrical charges in an array (columns and rows) of storage cells. Dynamic RAM (DRAM) storage cells are extremely small, but have only relatively short-term storage capability and must be "refreshed" periodically. Static RAM (SRAM) storage cells have the capability of retaining data values as long as power is applied without needing to be refreshed. Interface logic controls the writing of data to and the reading of data from the memory array. Data is typically stored as bytes, or some multiple thereof, each byte representing eight bits of binary information. For example, a given single data value may be 8, 16, 32, 64 or more binary bits "wide", requiring corresponding 8, 16, 32, 64 or more storage cells in the memory array.

Content Addressable Memory (CAM), is a special type of memory, typically RAM-based memory, with built in searching capabilities. As its name implies, in addition to being able to store and retrieve data items at addressable locations within the memory, CAM can also respond with the address of a memory location that has a data item that matches a user-specified search criterion. In effect, CAM memory cells behave like conventional RAM cells with embedded comparators capable of comparing a search key value against the contents of all memory cells of the CAM at once.

Typically CAMs have a masking capability so that the comparisons can be restricted to only certain bits within each memory location, and so that selected memory locations or ranges of memory locations can be excluded from the search. Inputs to the CAM (i.e., address input/output, data input/output, search word, etc.) are typically routed via interconnection circuitry, CAM-based memories are extremely valuable in database applications, high-speed network routing and bridging applications, data compression applications, memory caches, disk caches, and the like, since they completely automate the process of table searching. The same functions implemented on a general purpose processor using a table stored in conventional RAM could require an exhaustive search of the table. Even if the table is sorted, such a table search would require numerous individual, separate accesses and comparisons. Content addressable memory completely bypasses this problem by performing table searches effectively instantaneously by examining all table locations in parallel. In a sense, "CAM" can be considered to be a search engine linked with a memory array.

Until recently, integrated CAM was only available in small increments and at a high price. In the last couple of years, however, more semiconductor manufacturers have begun to include sizeable integrated CAMs in their product lines. For example, Motorola has recently announced a one-megabit CAM having a storage and search capacity of 16,384 64-bit words. With the advent of such high density CAM devices, system designers are increasingly turning towards CAM as a solution to many table searching problems.

Integrated CAMs, however, have the drawback that their logic interface is often optimized for a specific application, sometime making them less than ideal for other applications. Sometimes, system designers must go to great lengths to "design around" the specific interface characteristics of a less-than ideal CAM, often paying a performance penalty in the process. Further, in order to make better and more efficient use of the CAM, it would be desirable to dynamically re-configure the interface characteristics of a CAM to more ideally suit dynamically varying operating modes and conditions of the systems that utilize the CAM. This is difficult, if not impossible, using fixed-function, commercially available CAMs.

A typical system design including integrated CAM involves one or more CAM chips, and either custom/semi-custom interface logic (e.g., standard cell, gate array, etc.) or fully programmable interface logic (e.g., FPGA). The custom/semi-custom logic is considerably less expensive on a per-piece basis, but is only cost-effective in high-volumes and has little flexibility. The FPGA (Field Programmable Gate Array) is more expensive on a per-gate basis, but is extremely flexible and cost-effective in low volume. Some FPGA technologies are dynamically re-programmable in-circuit, increasing their flexibility.

Standard-cell, gate array, FPGA, and similar technologies of a wide variety of types are well known to those of ordinary skill in the art and will not be further elaborated upon herein.

In an attempt to provide better circuit density, greater performance, and a better match to their system requirements, some system designers have attempted to combine the CAM and the interface circuitry into a single chip. One method has been to create an Application Specific Integrated Circuit (ASIC) which incorporates CAM as a standard "core" block. While providing good circuit density and function, this approach requires considerable up-front effort and expense (e.g., NRE—non-recurring engineering costs), a great deal of troubleshooting and testing time, and little flexibility. Once the ASIC is integrated, it is impractical to go back and make minor changes, due to the associated expense and long lead times.

Another approach to integrating CAM and interface logic on a single chip has been to implement CAM as a gate-level design in a large FPGA. While workable and extremely flexible, this approach is suited only to very small CAMs and requires more than 10 times the silicon area (and consequently more than ten times the cost) of a comparable CAM "core" block.

Evidently, there is a need for a low-cost, flexible, technique for combining CAM function with flexible interface logic.

2. Discussion of the Prior Art

The following documents, all of which are U.S. patents, all of which are incorporated by reference herein, disclose various memory management techniques.

U.S. Pat. No. 5,299,147 (November 1972) discloses a decoder scheme for fully associative translation look-aside buffer, and has a capability to change the connection between a CAM block and a RAM block so that the translation can be done without any additional delay. However, in contrast to the present invention, this patent does not suggest or describe a connection between CAM and programmable logic, and does not have programmable gate array (e.g., FPGA) capability.

U.S. Pat. No. 5,701,488 (December 1997) discloses method and apparatus for restoring a target MCU debug session to a prior state.

U.S. Pat. No. 5,408,434 (April 1995) discloses a memory device that functions as a content addressable memory or a random access memory. This patent describes a programmable logic circuit, using a small CAM block in it, which performs the small programmable logic function for field programmable fate array (FPGA). The FPGA is constructed with an array of the programmable logic circuit with routing resources, and improves the efficiency of the programmable logic circuit itself because the programmable logic circuit has a small CAM function which can be used as both a lookup table and combinational logic. In contrast to the present invention, due to the fact that the CAM block in this patent is distributed to each programmable circuit, it would be difficult to achieve a large-size CAM function in the device. U.S. Pat. No. 5,473,267 (December 1995) is a division of the U.S. Pat. No. 5,408,434 and discloses a programmable logic device with memory that can store routing data or logic data.

U.S. Pat. No. 5,515,327 (May 1996) discloses a nonvolatile semiconductor memory device having small number of internal boosting circuits. Programmable logic and CAM are not described in this patent.

U.S. Pat. No. 5,519,649 (May 1996) discloses a microprocessor having rapid condition comparison function. Programmable logic and CAM are not described in this patent.

Commonly-owned U.S. Pat. No. 5,282,163 (January 1994) discloses a programmable logic device with circuit portions common to both configuration and use circuits. CAM is not described in this patent.

U.S. Pat. No. 5.426,769 (June 1995) discloses system and method for producing input/output expansion for single chip microprocessors. Programmable logic is not described in this patent. A comparison circuit for an address decoder is described, but not in the context of CAM.

U.S. Pat. No. 5,388,065 (February 1995) discloses a semiconductor integrated circuit which is a CAM memory which comprises at least one memory cell including a first storage unit for defining the electrical connection and otherwise the non-connection between a first data line and a match line and a second storage unit for defining the electrical non-connection and otherwise the connection between a second data line and the match line, and a control word line for controlling said first and second storage units in the memory cell, the match line corresponding to at least one of the control word lines, the control word line being used to effect the connection and otherwise non-connection between each of said first and second data lines and the match line in accordance with the definition of connections of said first and second storage units. Moreover, the storage unit can be composed of various memory elements such as MONOS-type nonvolatile memory, PROM, EPROM, EEPROM, UVEPROM, and the like. The CAM memory comprises at least one of potential detecting means, holding means for holding the result of detection in response to each control word line, and preventing means for preventing the through current between the memory cells in conformity with and in nonconformity with the retrieval data. In this patent, a CAM device is described. In contrast to the present invention, a combination of programmable logic and CAM is not described.

U.S. Pat. No. 5,685,006 (November 1997) discloses an application specific integrated circuit having hierarchical structure and method of organizing such circuit using inheritance information. The patent describes a programmable wiring generation circuit, but does not describe programmable logic as contemplated by the present invention. Moreover, the patent does not suggest any CAM capability.

U.S. Pat. No. 5,687,325 (November 1997) discloses an application specific field programmable gate array which includes application specific functions such as event timers, interrupt controllers, etc., but which makes no mention of CAM. In this patent, the connection between general purpose FPGA and application specific functions is fixed, in marked contrast to the present invention.

U.S. Pat. No. 5,557,218 (September 1996) discloses a reprogrammable programmable logic array comprising a first write module for inputting data to be written and data to be compared, and an AND CAM cell array block for, in a first write mode, sequentially storing the write data from the first write module and, in a match mode, comparing the comparison data from the first write module with its pre-stored data and generating match signals in accordance with the compared result, a first address module for, in the write mode, generating sequential addresses and supplying the generated sequential addresses to the AND CAM cell array block, a second write module for inputting data to be written in the write mode, an OR CAM cell array block for storing sequentially the write data from the second write module in the write mode and detecting its pre-stored data corresponding to the match signals from the AND CAM cell array block in the match mode, a second address module for, in the write mode, generating sequential addresses and supplying the generated sequential addresses to the OR CAM cell array block, and an output module for transferring the output data from the OR CAM cell array block externally in the match mode. A reprogrammable programmable logic array further comprises a buffer module for buffering the match signals from the AND CAM cell array block. Generally, this patent describes the structure of the programmable logic itself.

U.S. Pat. No. 5,559,981 (September 1996) discloses a pseudo static mask option register and method therefor. The pseudo-static mask option register combines features of both a continuous refresh design and a static latched mask option register design, and is useful for single chip microcontrollers when changing some functions for different customers.

U.S. Pat. No. 5,576,985 (November 1996) discloses an integrated content addressable read only memory that can be used as a Content Addressable Memory (CAM) or as a Random Addressable Memory (RAM) useful, for example, for applications in data compression or video compression.

U.S. Pat. No. 5,581,501 (December 1996) discloses nonvolatile SRAM cells and cell arrays.

U.S. Pat. No. 5,600,820 (February 1997) discloses a method for partitioning memory in a high speed network based on the type of service.

U.S. Pat. No. 5,615,404 (March 1997) discloses a system having independently addressable bus interfaces coupled to serially connected multi-ported signal distributors generating and maintaining frame based polling schedule favoring isochronous peripherals.

U.S. Pat. No. 5,664,198 (September 1997) discloses high speed access to PC card memory using interrupts.

U.S. Pat. No. 5,051,949 (September 1991) discloses a content addressable memory device. Programmable logic capability is not discussed.

U.S. Pat. No. 4,646,271 (February 1987) discloses content addressable memory having dual access modes. Programmable logic capability is not discussed.

Glossary

Unless otherwise noted, or as may be evident from the context of their usage, any terms, abbreviations, acronyms or scientific symbols and notations used herein are to be given their ordinary meaning in the technical discipline to which the invention most nearly pertains. The following terms, abbreviations and acronyms may be used in the description contained herein:

| | |
|---|---|
| A/D: | Analog-to-Digital (converter). |
| ALU: | Arithmetic Logic Unit. |
| ASIC: | Application-Specific Integrated Circuit. |
| ATM: | Asynchronous Transfer Mode |
| bit: | binary digit. |
| byte: | eight contiguous bits. |
| CAM: | Content-Addressable Memory. |
| CMOS: | Complementary Metal-Oxide Semiconductor. |
| CODEC: | Encoder/De-Coder. In hardware, a combination of A/D and D/A converters. In software, an algorithm pair. |
| CPU: | Central Processing Unit. |
| D/A: | Digital-to-Analog (converter). |
| DRAM: | Dynamic Random Access Memory |
| DSP: | Digital Signal Processing (or Processor) |
| EEPROM: | Also E2PROM. An electrically-erasable EPROM. |
| EPROM: | Erasable Programmable Read-Only Memory. |
| Flash: | Also known as Flash ROM. A form of EPROM based upon conventional UV EPROM technology but which is provided with a mechanism for electrically pre-charging selected sections of the capacitive storage array, thereby effectively "erasing" all capacitive storage cells to a known state. |
| FPGA: | Field-Programmable Gate Array |
| G: | or (giga), 1,000,000,000 |
| Gbyte: | gigabyte(s). |
| GPIO: | General Purpose Input/Output. |
| HDL: | Hardware Description Language. |
| IC: | Integrated Circuit. |
| IP: | Internet Protocol. |
| I/O: | Input/Output. |
| IEEE: | Institute of Electrical and Electronics Engineers |
| JPEG: | Joint Photographic Experts Group |
| k: | (or kilo), 1000. |
| kHz: | KiloHertz (1,000 cycles per second). |
| MAC: | Media Access Control. |
| Mask ROM: | A form of ROM where the information pattern is "masked" onto memory at the time of manufacture. |
| MCM: | Multi-Chip Module. |
| memory: | hardware that stores information (data). |
| M: | (or mega), 1,000,000 |
| MHz: | MegaHertz (1,000,000 cycles per second). |
| MLT: | Multi-Level Technology. |
| NVRAM: | Non-volatile RAM. |
| PLL: | Phase Locked Loop |
| PROM: | Programmable Read-Only Memory. |
| PWM: | Pulse Width Modulation. |
| PLD: | Programmable Logic Device. |
| RAM: | Random-Access Memory. |
| RISC: | Reduced Instruction Set Computer (or Chip). |
| ROM: | Read-Only Memory. |
| SIE: | Serial Interface Engine. |
| software: | Instructions for a computer or CPU. |
| SRAM: | Static Random Access Memory. |
| UART: | Universal Asynchronous Receiver/Transmitter. |
| USB: | Universal Serial Bus. |
| UV EPROM: | An EPROM. Data stored therein can be erased by exposure to Ultraviolet (UV) light. |
| VHDL: | VHSIC (Very High Speed Integrated Circuit) HDL. |

BRIEF DESCRIPTION (SUMMARY) OF THE INVENTION

An object of the present invention is to provide an improved technique for utilizing CAM memory.

Another object of the invention is to provide a technique for permitting a user to change CAM search algorithms in the field.

Another object of the invention is to provide a technique for permitting a user to configure word-length, thereby tailoring memory to the particular application.

According to the invention, an optimized Content Addressable Memory "core" block is integrated onto a single Integrated Circuit (IC) chip along with a user-configurable logic such as a Field Programmable Gate Array (FPGA), with inputs and outputs to the CAM being provided as outputs and inputs, respectively, to programmable cells of the FPGA.

According to an aspect of the invention, the FPGA function is dynamically re-programmable, permitting in-circuit re-configuration of the FPGA logic and its interface to the CAM "core" block.

An integrated circuit (IC) employing the techniques of the present invention may be included in a system or subsystem having electrical functionality. Example systems may include general purpose computers; telecommunications devices (i.e., phones, faxes, etc.); networks; consumer devices; audio and visual receiving, recording and display devices; vehicle; etc. It is within the scope of the invention that such systems would benefit substantially from technique(s) of the present invention.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments. Certain elements in selected ones of the drawings are illustrated not-to-scale, for illustrative clarity. Often, similar elements throughout the drawings are referred to by similar references numerals. For example, the element 199 may be similar in many respects to the element 299 in another figure. Also, often, similar elements are referred to with similar numbers in a single drawing. For example, a plurality of elements 199 may be referred to as 199a, 199b, 199c, etc.

DETAILED DESCRIPTION OF THE INVENTION

Figure 1:
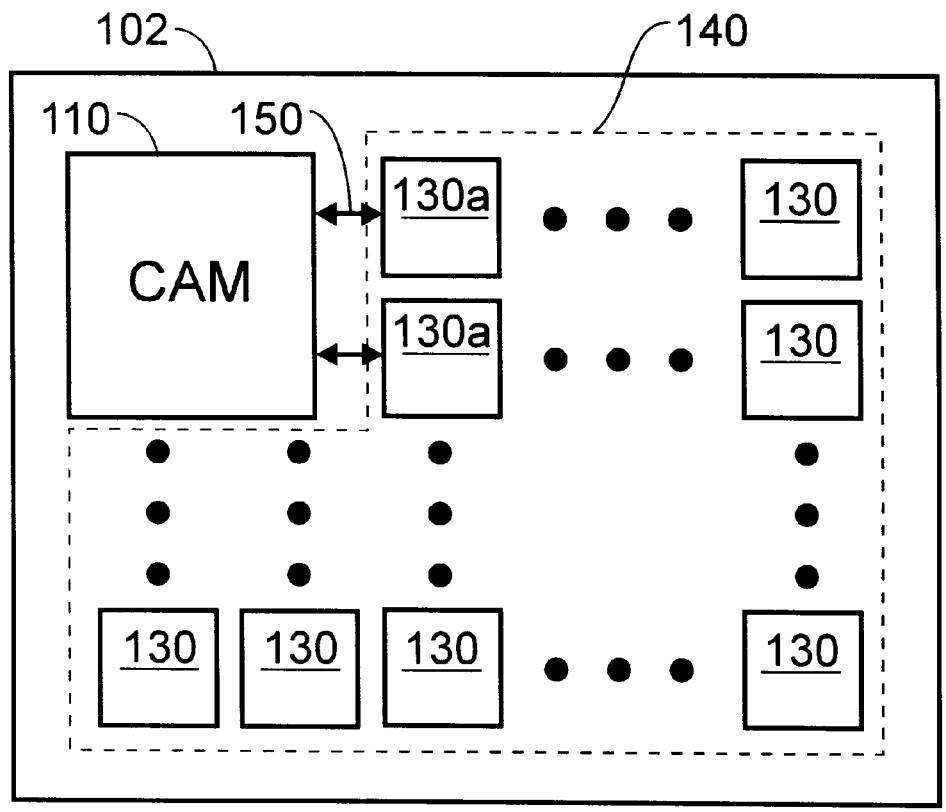
FIG. 1 is a block diagram of a technique for embedding Content-Addressable Memory (CAM) in a Field Programmable Gate Array (FPGA) on an integrated circuit (IC) chip, according to the present invention.

FIG. 1 illustrates a technique 100 for integrating user-configurable logic and CAM memory on a single integrated circuit (IC) chip 102. A CAM core-block 110 is fabricated on a portion of the IC chip 102. A plurality of programmable (configurable) logic cells 130 are formed on an other portion of the chip and are suitably a field-programmable gate array (FPGA) 140 (shown within the dashed line).

Selected ones 130a of the logic cells 130 are arranged and disposed to receive interface signals on lines 150 from the CAM core-block 110, thereby making them available to the remainder of the programmable logic cells 130. These interface logic cells 130a comprise, in essence, a programmable interconnection member for interfacing logic implemented by the user in the FPGA 140 (comprising of programmable logic cells 130) to the CAM core-block 110.

Figure 2:
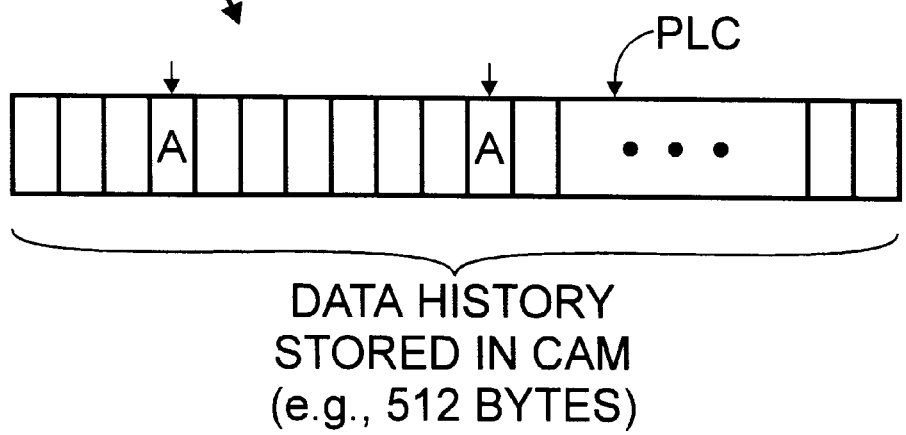
FIG. 2 is a diagram of an example of data history stored in memory, according to the invention.

FIG. 2 illustrates an example 200 of an application for the integrated FPGA/CAM IC chip 100 of FIG. 1. A data compression scheme is implemented whereby the CAM 110 is utilized to store data history. In this example, there are 512 individual bytes of data history, and a searched-for occurrences of a data value "A" has been located in two of these bites (shown with the symbol "↓" above each of those two bytes). After finding the matching data bytes, any suitable algorithm can be employed to compress the data. Importantly, the algorithm can be changed to meet various data compression requirements. Such re-configurability is of great benefit in an number of applications.

By using the CAM 110 to instantaneously and automatically detect multiple occurrences of the same data word in the data history, data frequency information is rapidly and readily obtained. Since many data compression techniques employ optimum statistical coding based upon the frequency of occurrence of data patterns, this technique provides dramatic speed improvements over data compression techniques which do not employ CAM. The FPGA logic 140 surrounding the CAM 110 is used to configure provide interface circuitry to a host processor and to configure the format of the CAM search results into a form best suited to the data compression algorithm in use. If a different algorithm is chosen, the FPGA cells can dynamically be reprogrammed.

The integration of configurable logic (e.g., FPGA 140) and CAM memory (110) allows a user to implement various algorithms as an application may dictate.

Also, the user may change word length, in the field. For example, an Asynchronous Transfer Mode (ATM) application may require a 28-bit to 32-bit word length, an Ethernet application may require a 48-bit to 64-bit word length, and an Internet Protocol (IP) address may require a total of a 160-bit word length. The various protocols for various applications are well known, and do not form part of the invention per se.

By integrating FPGA with CAM, the ability to configure for a given application having a given word length can dramatically speed up processing time. For example, if memory were configured to a 32-bit word length, and an application called for a 48 or 64-bit word length, conventional techniques having fixed word length would not be able to do the required search with the same manner (and may, for example, require TWO cycles to fetch the word). According to the present invention, the user can configure memory to any desired word length, and could search (e.g., fetch) the aforementioned 48 or 64-bit words in one cycle. Hence, the processing overhead in searching for any word in excess of 32-bits is dramatically improved by the flexible architecture of the present invention.

Physical Implementation

There has been described, hereinabove, an integrated circuit (IC) chip 100 having an embedded CAM (110) and embedded configurable logic (140).

The IC chip 100 is readily designed using a variety of available design tools (e.g., HDL, VHDL) and is readily manufactured using conventional semiconductor processing techniques. Designs may be modeled and validated, prior to manufacturing a device, using any of a number of simulation tools, such as Verilog (tm). And a number of "floorplanning" tools are available to optimize the layout of circuits and functional blocks on the IC chip.

Modern semiconductor devices generally (typically) comprise hundreds of thousands (and sometimes millions) of "gates" which are the primitive "building blocks" for complex devices. Thousands or tens of thousands of gates may be interconnected to form a single functional block such as the various functional blocks described hereinabove (media processor, reconfigurable logic, etc.).

System Integration

It is clearly contemplated that the technique(s) of the present invention, as disclosed hereinabove, can be integrated with other electronic components and subsystems to realize a subsystem or a system having electrical functionality such as, but not limited to: general-purpose computers; telecommunication devices (e.g., phones, faxes, etc); networks; consumer devices; audio and visual (video) receiving, recording and display devices and systems; and vehicles such as planes, trains and automobiles.

Figure 3:
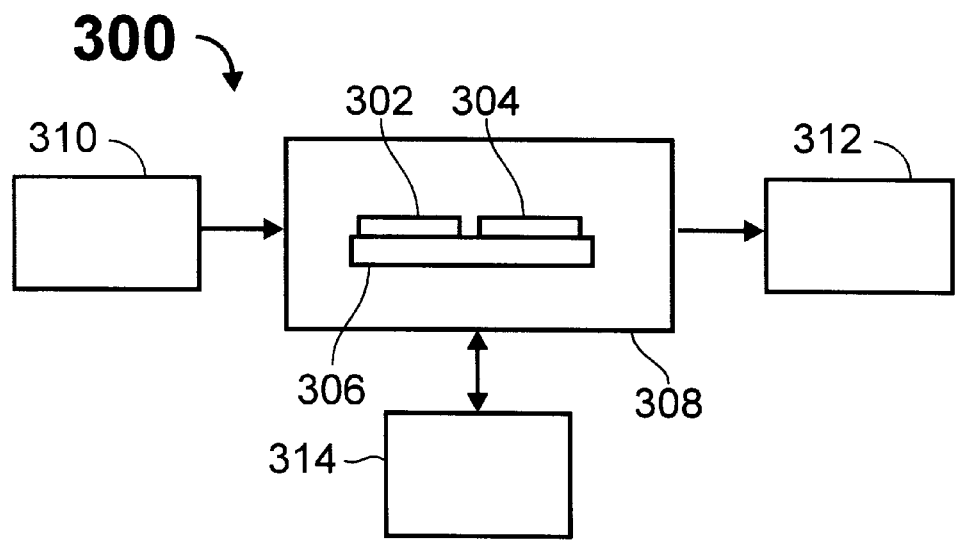
FIG. 3 is a schematic block diagram of a system incorporating the technique(s) of the present invention.

FIG. 3 illustrates an example of such an overall system 300. As shown therein, an electronic component 302 incorporating the technique(s) of the present invention can be connected, along with at least one other electronic component 304, on an interconnection substrate (e.g., motherboard) 306, thereby forming a subsystem 308, to which a number of peripheral (e.g., external) devices may be connected. Exemplary peripheral devices may include:

one or more devices 310 for providing inputs to the subsystem 308, such as keyboards, pointing devices, digitizing tablets, and the like;

one or more devices 312 for receiving outputs from the subsystem 308, such as video monitors, and the like; and one or more devices 314 for engaging in two-way communications with the subsystem 308, such as modems, printers, and the like.

It is clearly within the purview of a person having ordinary skill in the art to which the present invention most nearly pertains to effect such system integration, based on the descriptions set forth hereinabove.

Figure 3A:
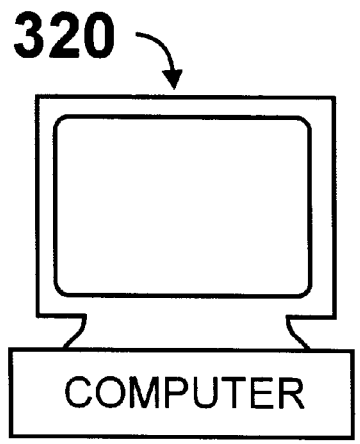
FIG. 3A is an illustration of a general purpose computer incorporating the technique(s) of the present invention.

FIG. 3A illustrates, for example, a general purpose computer 320 (compare 300) incorporating the present invention.

Figure 3B:
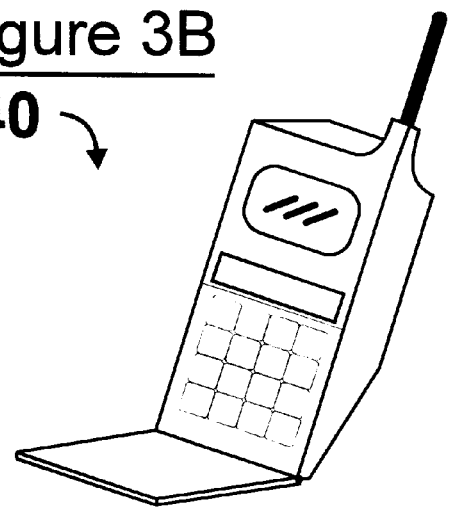
FIG. 3B is an illustration of a wireless telephone (cell phone) incorporating the technique(s) of the present invention.

FIG. 3B illustrates, for example, a wireless telephone 340 (compare 300) incorporating the present invention.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" the "themes" set forth hereinabove will occur to one having ordinary skill in the art to which the present invention most nearly pertains, and such variations are intended to be within the scope of the invention, as disclosed herein.

What is claimed is:

1. A memory device, comprising:
   an integrated circuit (IC) chip;
   a Content Addressable Memory (CAM) "core" block integrated onto the IC chip; and user-configurable logic integrated onto the IC chip;

wherein the user-configurable logic is capable of being configured to establish one of a variety of word lengths for words stored in the memory core block.

2. The memory device, according to claim 1, wherein:

the user-configurable logic is implemented as a Field Programmable Gate Array (FPGA).

3. The memory device, according to claim 1, wherein:

a portion of the user-configurable logic is provided with inputs and outputs to the CAM being provided as outputs and inputs, respectively, to programmable cells in other portions of the user-configurable logic.

4. A method of detecting occurrences of data in a memory array, comprising:

integrating a content addressable memory (CAM) core and a user-configurable logic core on a single integrated circuit (IC) chip; and configuring the user-configurable logic to establish one of a variety of word lengths for words stored in the memory.

5. A method of data compression comprising:

integrating a content addressable memory (CAM) core and a user-configurable logic core on a single integrated circuit (IC) chip;

searching matching data bytes in the CAM; and configuring the user-configurable logic to format results of the searching into a form suited to one of a variety of data compression algorithms.

6. An electronic system incorporating at least one integrated circuit (IC chip), said IC chip comprising:

a Content Addressable Memory "core" block integrated onto the IC chip; and user-configurable logic integrated onto the IC chip;

wherein the user-configurable logic is capable to be configured to establish one of a variety of word lengths for words stored in the memory.

7. The electronic system, according to claim 6, wherein the electronic system is selected from the group consisting of general-purpose computer, telecommunication device, network device, consumer device, receiver, recorder, display device, and vehicle.

* * * * *